United States Patent
Cooley et al.

(10) Patent No.: US 7,738,851 B2
(45) Date of Patent: Jun. 15, 2010

(54) HARMONIC REJECTION MIXER

(75) Inventors: Daniel J. Cooley, Austin, TX (US);
Aslamali A. Rafi, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 922 days.

(21) Appl. No.: 11/528,039

(22) Filed: Sep. 27, 2006

(65) Prior Publication Data

US 2008/0076375 A1    Mar. 27, 2008

(51) Int. Cl.
*H04B 1/26* (2006.01)
(52) U.S. Cl. .............. 455/315; 455/146; 375/334; 329/325
(58) Field of Classification Search .......... 455/146, 455/313–315; 375/334; 329/325
See application file for complete search history.

(56) References Cited

U.S. PATENT DOCUMENTS 5,101,509 A * 3/1992 Lai .................. 455/183.1

| 6,766,158 | B1 | 7/2004 | Molnar et al. |
| 2005/0123025 | A1 | 6/2005 | Sorrells et al. |
| 2005/0221760 | A1* | 10/2005 | Tinsley et al. ........... 455/62 |
| 2005/0270172 | A1 | 12/2005 | Bailey et al. |
| 2006/0205370 | A1* | 9/2006 | Hayashi et al. ......... 455/209 |

OTHER PUBLICATIONS

US Patent Office, International Search Report and Written Opinion for corresponding International Application No. PCT/US2007/020505, 7 pgs., Mar. 31, 2008.
Jeffrey A. Weldon et al., entitled "A 1.75-GHz Highly Integrated Narrow-Band CMOS Transmitter With Harmonic-Rejection Mixers," IEEE Journal of Solid-State Circuits, vol. 36, No. 12, Dec. 2001, pp. 2003-2015.

* cited by examiner

*Primary Examiner*—Nhan Le
(74) *Attorney, Agent, or Firm*—Trop, Pruner & Hu, P.C.

(57) ABSTRACT

A technique includes providing a plurality of local oscillator signals such that each of the local oscillator signals has a different phase. The technique includes providing scaling units to scale the input signal pursuant to different scaling factors to generate scaled input signals. The scaling factors are selected on a periodic function of the phases. The technique also includes providing mixing circuits to mix the local oscillator signals with the scaled input signals to generate mixed signals and providing an adder to combine the mixed signals to generate an output signal.

18 Claims, 6 Drawing Sheets

US 7,738,851 B2

HARMONIC REJECTION MIXER

BACKGROUND

The invention generally relates to a harmonic rejection mixer.

A conventional wireless receiver system may include at least one mixer, for purposes of downconverting the frequency of the incoming wireless signal. More specifically, the mixer typically multiplies the incoming wireless signal with a local oscillator signal to produce a signal, which has spectral energy that is distributed at sums and differences of the local oscillator and incoming signals' frequencies. If the local oscillator signal is a pure sinusoid that has its spectral energy concentrated at a fundamental frequency, then ideally, it is relatively easy to filter out unwanted spectral energy so that the spectral energy of the filtered signal is generally located at the desired intermediate frequency. However, for certain mixing applications, the local oscillator signal may be a non-sinusoidal, such as a square wave signal, which contains spectral energy that is located at a fundamental frequency and additional spectral energy that is located at harmonic frequencies. Mixing the incoming signal with such a local oscillator signal typically results in undesired spectral energy being located close enough to the desired spectral energy to make the undesired spectral energy relatively difficult to remove by filtering.

Thus, there exists a continuing need for a mixer that rejects harmonic frequencies that may be introduced by a local oscillator signal that is not a pure sinusoid.

SUMMARY

In an embodiment of the invention, a technique includes providing a plurality of local oscillator signals such that each of the local oscillator signals has a different phase. The technique includes providing scaling units to scale the input signal pursuant to different scaling factors to generate scaled input signals. The scaling factors are selected on a periodic function of the phases. The technique also includes providing mixing circuits to mix the local oscillator signals with the scaled input signals to generate mixed signals and providing an adder to combine the mixed signals to generate an output signal.

Advantages and other features of the invention will become apparent from the following drawing, description and claims.

DETAILED DESCRIPTION

Figure 1:
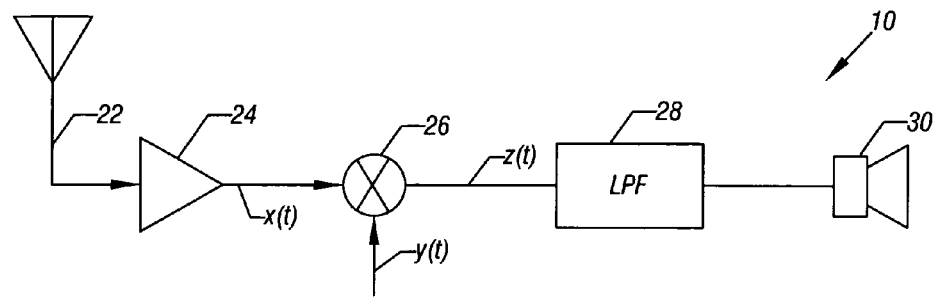
FIG. 1 is a schematic diagram of a wireless receiver system.

Referring to FIG. 1, a receiver system 10 may include a mixer 26 that frequency translates an incoming signal (called "x(t)") to produce a frequency translated signal (called "z(t)") by multiplying the x(t) signal with a local oscillator signal (called "y(t)"). As an example, the x(t) signal may be a modulated signal that is provided by an amplifier 24, in response to a signal (an AM or FM signal, for example) that is received from an antenna 22. Due to the frequency translation by the mixer 26, the receiver system 10 may further process the z(t) signal to remove unwanted spectral energy, such as processing that includes passing the z(t) signal through a lowpass filter (LPF) 28 to recover for purposes of producing an audio signal that may be played over a speaker 30. A particular challenge may arise if the y(t) local oscillator signal is a square wave, which has spectral energy that is located at fundamental and harmonic frequencies.

Figure 2:
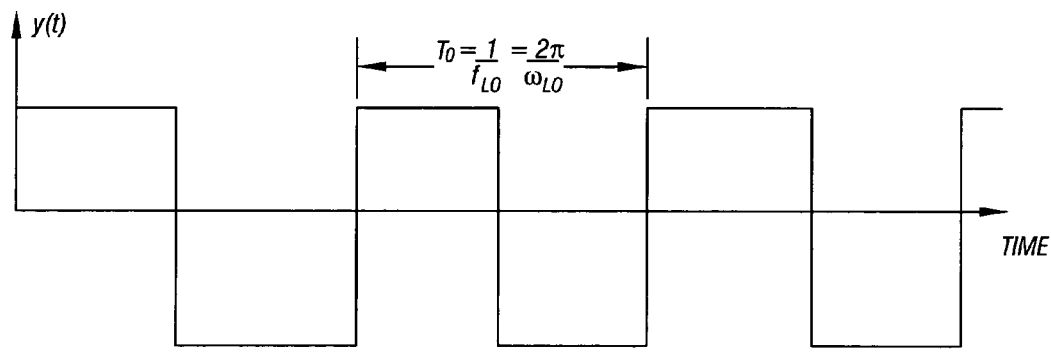
FIG. 2 is a waveform of a square wave signal.
Figure 3:
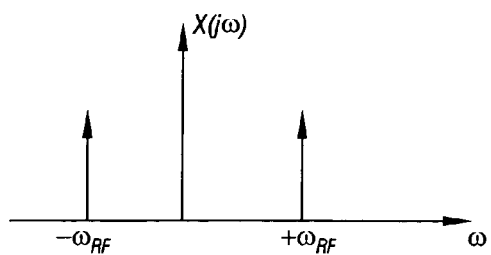
FIG. 3 is an illustration of spectral content of an input signal to a mixer of FIG. 1.

More particularly, referring to FIG. 2 in conjunction with FIG. 1, the y(t) signal may be a square wave signal that has a fundamental frequency (called "$f_{LO}$") and harmonic frequencies, which introduce undesirable spectral energy in the z(t) signal. To illustrate this problem, FIG. 3 depicts the spectral content of the x(t) signal, where the x(t) signal is assumed to be of the following form:

$$x(t)=a \cdot \cos(\omega_{RF}t), \qquad \text{Eq. 1}$$

where "$\omega_{RF}$" represents a radian radio frequency (RF) ($2\pi \cdot f_{Rf}$). The spectral content of the x(t) signal for this example is depicted in FIG. 3. As shown, the spectral content includes components 52 and 50 that are located at positive and negative RF frequencies, respectively.

Figure 4:
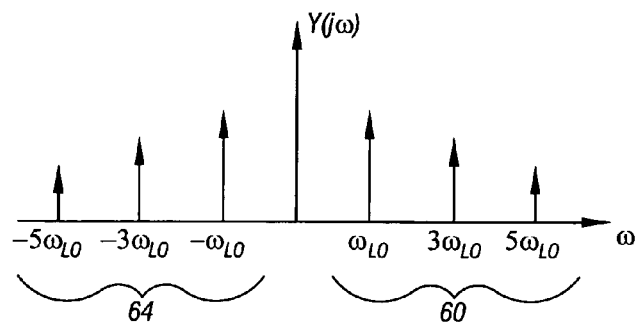
FIG. 4 is an illustration of spectral energy of a local oscillator signal used by the mixer of FIG. 1.

Referring also to FIG. 4, for this example, the y(t) signal, being a square wave signal, has spectral components 60 that are located not only at the fundamental frequency, $\omega_{LO}$, but are also located at odd harmonic frequencies $\omega_{LO}$. Similarly, the y(t) signal has spectral components 64, which are located at the negative $\omega_{LO}$ fundamental frequency and odd harmonics thereof.

Figure 5:
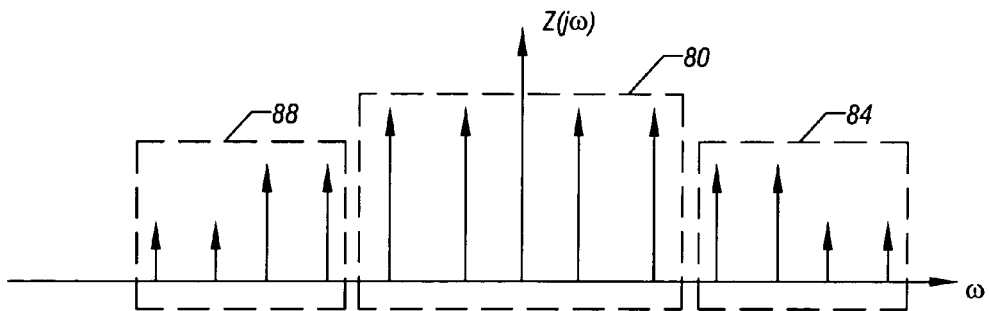
FIG. 5 is an illustration of spectral energy of an output signal provided by the mixer of FIG. 1.

As a result of the harmonics that are present in the y(t) signal, the resultant z(t) signal has undesired spectral components 84 and 88, which are depicted in FIG. 5. More specifically, the multiplication of the y(t) and x(t) signals by the mixer 26 produces desired spectral energy 80, due to the fundamental frequency component of the y(t) signal and also produces the unwanted spectral components 84 and 88 due to the harmonics of the y(t) signal. The spectral components 84 and 88 may be relatively difficult to remove from the z(t) signal.

Figure 6:
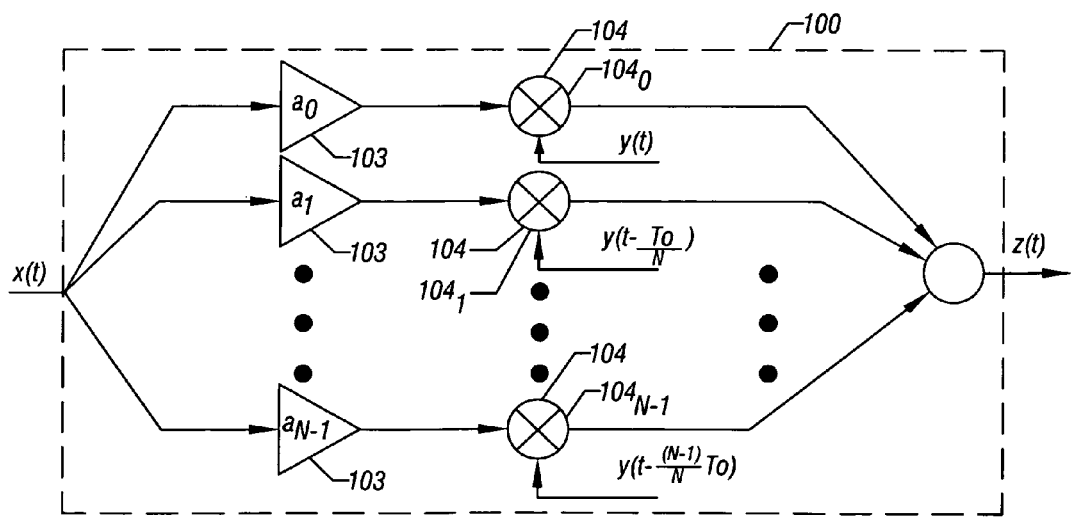
FIG. 6 is a schematic diagram of a mixer according to an embodiment of the invention.

To overcome the problems that are set forth above for a square wave or other non-pure sinusoid local oscillator signal, FIG. 6 depicts a harmonic rejection mixer 100 in accordance with embodiments of the invention. The mixer 100 includes N mixers 104 (mixers $104_0$, $104_1$ ... $104_{N-1}$, being depicted as examples in FIG. 6), each of which multiplies a scaled version of the x(t) signal with a square wave local oscillator signal. More specifically, each of the mixers 104, in accordance with embodiments of the invention described herein, multiplies a scaled version of the x(t) input signal with a square wave oscillator signal that has a different phase.

Figure 7:
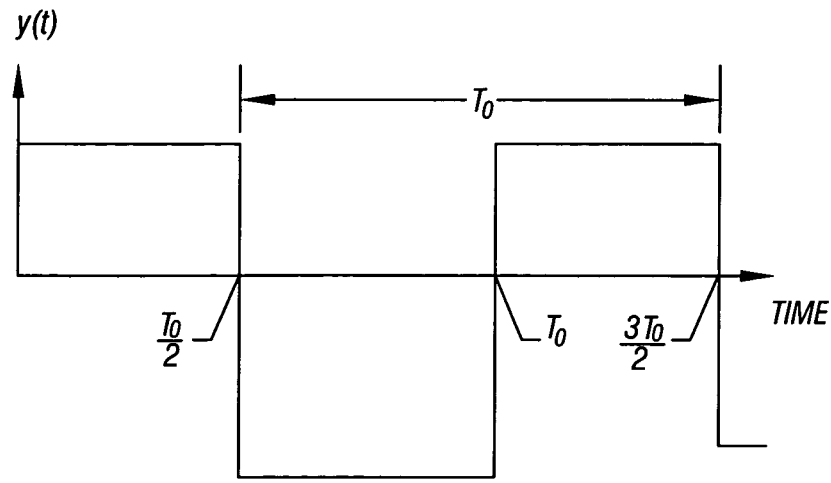
FIGS. 7, 8 and 9 illustrate local oscillator signals received by the mixer according to an embodiment of the invention.
Figure 8:
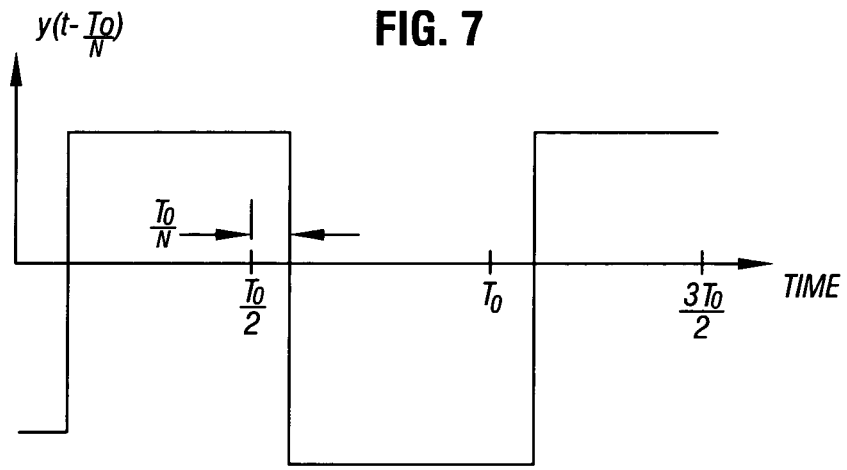
Figure 9:
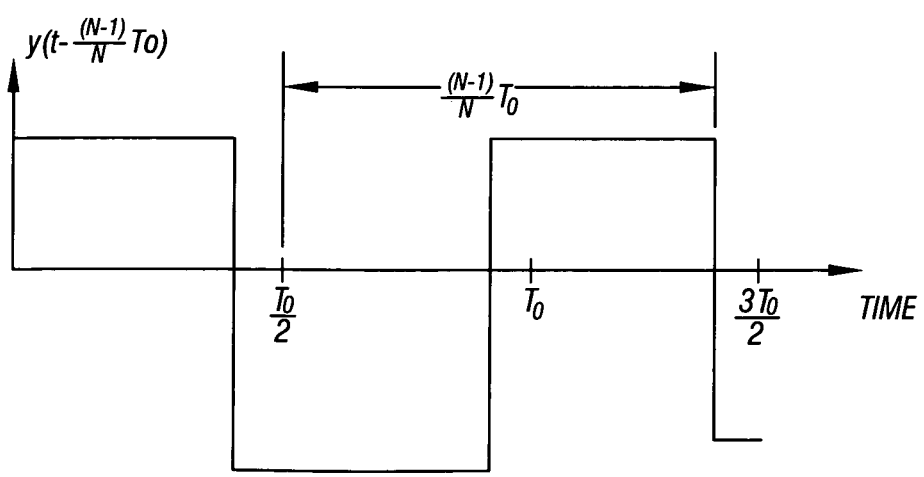

Referring also to FIGS. 7, 8 and 9, the square wave oscillator signals include a square signal (y(t)) (FIG. 7) that has a phase of zero and other square wave signals (such as exemplary square wave signals called $$"y\left(t - \frac{T_0}{N}\right)"$$

(FIG. 8) and $$"y\left(t - \frac{N-1}{N}T_0\right)"$$

(FIG. 9)). More particularly, the mixer $104_0$ receives the local oscillator signal y(t), which has a phase of zero, and each of the other mixers $104_1 \ldots 104_{N-1}$ receives a phase shifted version of the y(t) signal. The output signals that are produced by the mixers 104 are combined by an adder 105 to produce the z(t) signal.

Each of the mixers 104 receives a different scaled version of the x(t) signal. In this regard, the mixer 100 includes scaling units, or amplifiers 103, each of which is associated with a different one of the mixers 104. Each amplifier 103 scales the x(t) signal by a different factor, or degree, to produce the resultant scaled signal that is provided to the associated mixer 104. More specifically, the amplifier 103 for the mixer $104_0$ multiples the x(t) by a coefficient called "$a_0$," to produce a signal that is provided to the mixers $104_0$, the amplifier 103 multiplies the x(t) signal by a coefficient called "$a_1$" to produce a signal that is provided to the mixer $104_1$, etc. As described further below, the coefficients $a_0, a_1 \ldots a_{N-1}$ are selected to cancel harmonics in the z(t) signal.

The Fourier transform of the z(t) signal may be described as follows:

$$Z(j\omega) = Y(j\omega) \cdot \alpha(\omega), \quad \text{Eq. 2}$$

where "$Y(j\omega)$" represents the Fourier transform of the square wave signal y(t), and "$\alpha(\omega)$" represents a scaling factor in the frequency domain, which varies with frequency, as described below:

$$\alpha(\omega) = \sum_{k=0}^{N-1} a_k e^{\frac{-j\omega kT}{N}}, \quad \text{Eq. 3}$$

By choosing $a_k$ (wherein "k" is 0 to N−1) to be equal to a sinusoid that is function of the square wave phase, nulls are created in the spectral frequency of the z(t) signal due to the $\alpha(\omega)$ scaling factor becoming zero at certain frequencies. More specifically, in accordance with some embodiments of the invention, the $a_k$ coefficients are selected based on the following periodic function of the square wave phase:

$$a_k = \sin\left(\frac{2\pi}{N}k\right). \quad \text{Eq. 4}$$

The choice of N (the number of mixers 104) determines the harmonics that are cancelled by the mixer 100 (i.e., the frequency at which nulls occur).

If N is an odd, problems may arise when the duty cycle of the y(t) square wave signal is not exactly 50 percent. Therefore, in accordance with some embodiments of the invention, N is chosen to be even. With this selection, a the number of harmonics increases with N.

Figure 11:
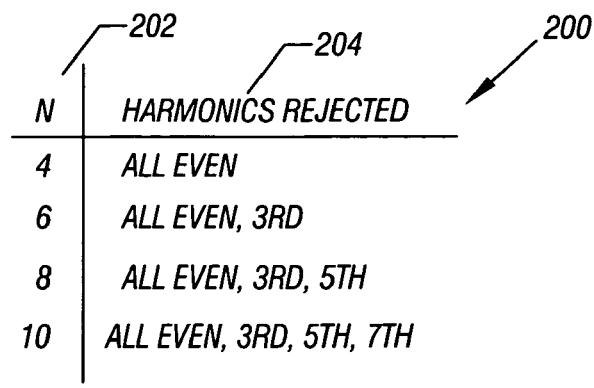
FIG. 11 is a table depicting harmonics rejected by the mixer for different implementations of the mixer according to embodiments of the invention.

In this regard, FIG. 11 depicts a table 200, which illustrates a relationship between N (in column 202) and the harmonics rejected (in column 204). As shown, for N equal to four, all even harmonics of the z(t) signals are rejected, for N equal to six, all even and the third harmonics are rejected. For N equal to eight, all even, third and fifth harmonics are rejected. Lastly, as depicted in table 200, for N equal to ten, all even, third, fifth and seventh harmonics are rejected.

Figure 10:
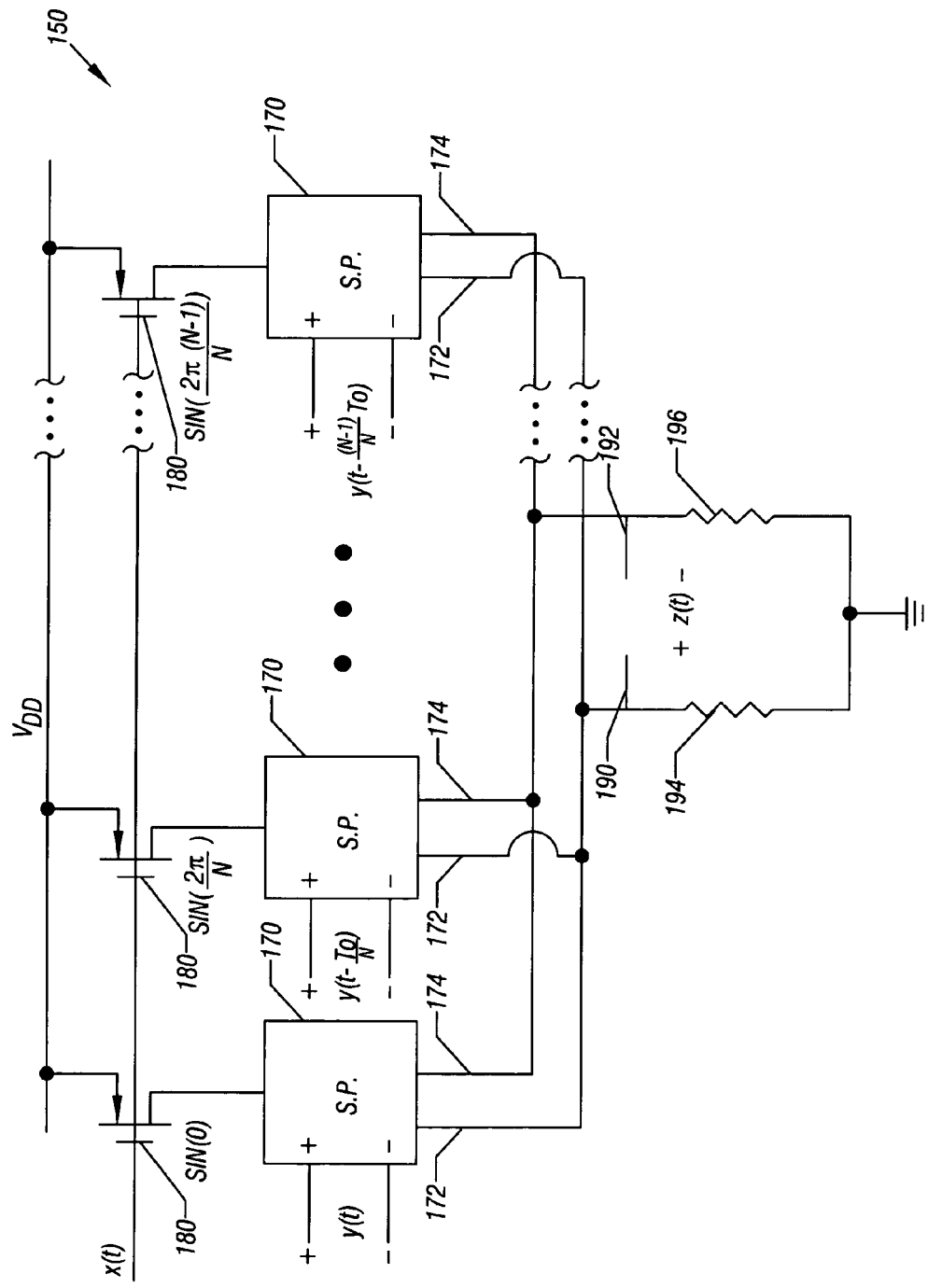
FIG. 10 depicts a circuit level implementation of the mixer according to an embodiment of the invention.

As a more specific example, FIG. 10 depicts a mixer 150 in accordance with embodiments of the invention. In particular, the mixer 150 implements paths that scale and frequency translate the x(t) signal, similar to the paths that are depicted in the mixer 100 of FIG. 6. Each of the paths include a current scaling transistor 180 (an n-channel metal oxide-semiconductor field-effect-transistor (NMOSFET), for example) and a square wave switching pair 170. The switching pair 170 connects the drain of the transistor 180 to either a positive output node 190 or a negative output node 192, depending on the plurality of the received square wave local oscillator signal. Because all of the switching pairs 174 are connected to the output terminals 190 and 192, the currents that are provided to the nodes 190 and 192 from the switching pairs 170 are summed to provide the collective z(t) output signal. As shown in FIG. 10, resistors 194 and 196 may be coupled between the nodes 190 and 192, respectively, and ground.

In accordance with some embodiments of the invention, the scaling for each path is provided by the current scaling transistor 180. In this regard, the transistors 180 have aspect ratios that are scaled with respect to each other to establish the different $a_k$ values. As shown by way of specific example in FIG. 10, the $a_k$ values may be different values obtained from the sinusoidal function (see Eq. 4) for the particular square wave phase.

Figure 12:
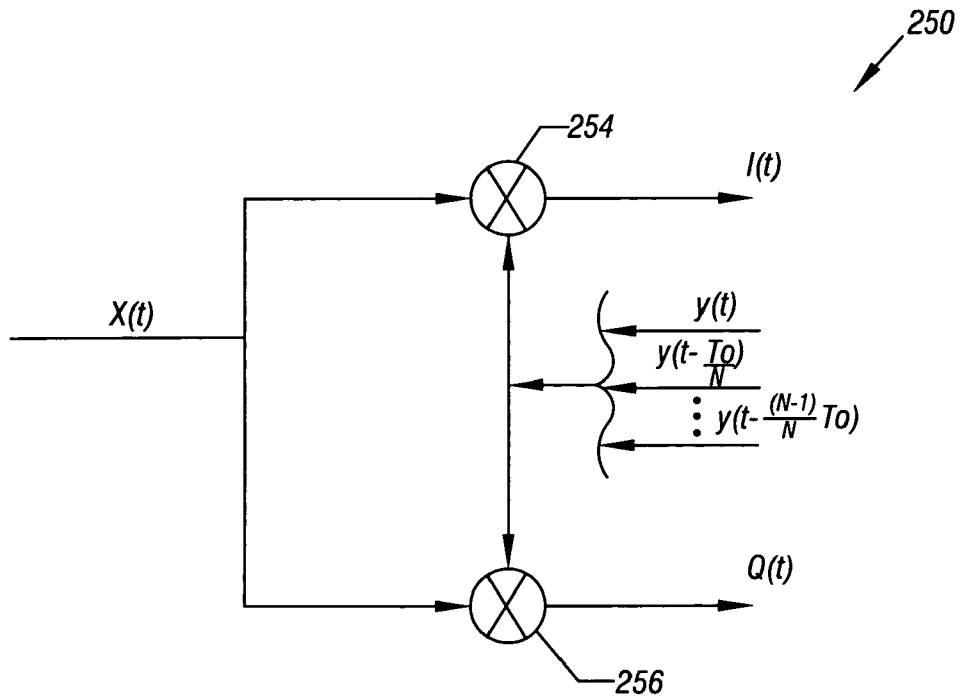
FIG. 12 is a schematic diagram of a mixer according to another embodiment of the invention.

The mixers that are described herein may be used in a variety of applications, including applications in which orthogonal signals are processed. In this regard, in accordance with some embodiments of the invention, the techniques and systems that are described herein may be applied to a mixer 250, which is depicted in FIG. 12. The mixer 250 frequency translates the incoming x(t) signal to produce two orthogonal signals: an in-phase signal (called "I(t)") and a quadrature signal (called "Q(t)"). The mixer 250 includes an in-phase mixer 254 that has a similar design to the mixers 100 and 150 described above. In this regard, the mixer 254 receives a set of phase-shifted square wave signals and provides the I(t) in-phase signal.

The mixer 250 also includes a mixer 256 that provides the Q(t) quadrature signal and receives the same set of phase-shifted square wave signals as the mixer 254. Unlike the mixer 254, the mixer 256 has $a_k$ coefficients that are derived from a cosine function of the square wave phase (instead of a sine function), as set forth below:

$$a_k = \cos\left(\frac{2\pi}{N}k\right). \quad \text{Eq. 5}$$

Figure 13:
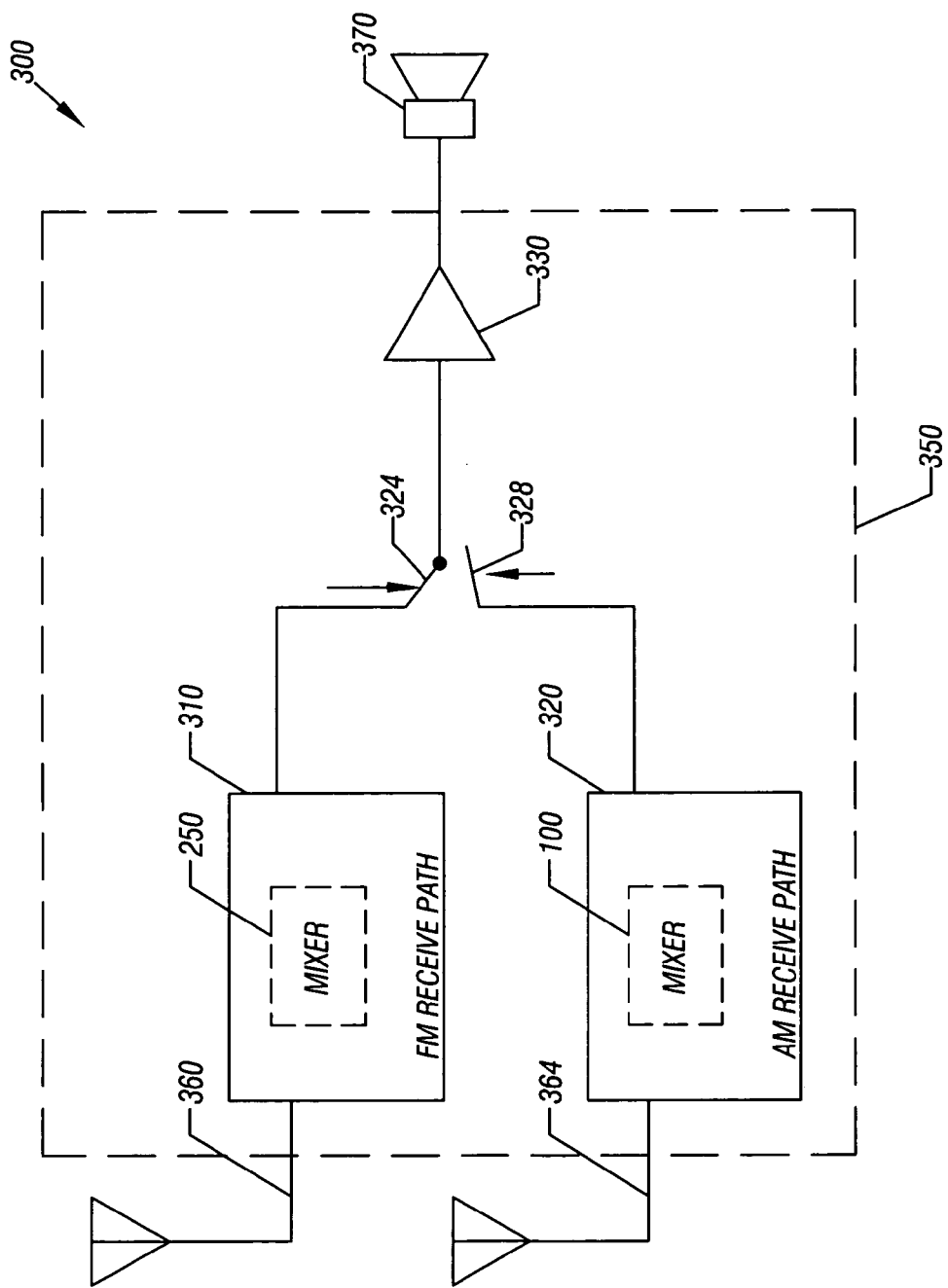
FIG. 13 is a schematic diagram of a wireless receiver system according to an embodiment of the invention.

Referring to FIG. 13, as an example of a possible application of the mixers described herein, the mixers 100 and 250 may be used in a wireless system 300. In this regard, the wireless system 300 may include, for example, an FM receive path 310 that includes the mixer 250 and may also include an AM receive path 320 that includes the mixer 100. In this regard, the FM 310 and AM 320 receive paths that may be part of a semiconductor package 350 that provides either an FM signal or an AM signal to an amplifier 330 that drives a speaker 370. Thus, a switch 324 may, in an FM receive mode of the package 350 couple the input terminal of the amplifier 330 to the output terminal of the FM receive path 310; and in an AM receive mode of the package 350, the switch 328 may alternatively connect the output terminal of the AM receive path 320 to the input terminal of the amplifier 330. Among its features, the wireless system 300 may include antennae 360 and 364 that are coupled to the FM 310 and AM 320 receive paths, respectively. In some embodiments of the invention, the semiconductor package 350 may also include an FM transmitter, which may be enabled or disabled, depending on the particular application in which the package 350 is used. In other embodiments of the invention, the FM 310 and AM 320 receive paths may be formed on the same die, may be formed on separate dies, and may be parts of separate semiconductor packages. Thus, many variations are possible and are within the scope of the appended claims.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
providing a plurality of local oscillator signals, each of the local oscillator signals having a different phase;
providing scaling units to scale an input signal pursuant to different scaling factors to generate scaled input signals;
selecting the scaling factors based on a periodic function of the phases, the periodic function comprising one of the following mathematical functions: $\sin(2\pi \cdot k/N)$ and $\cos(2\pi \cdot k/N)$, wherein k is a phase index and N is a number of the phases;
providing mixing circuits to mix the local oscillator signals with the scaled input signals to generate mixed signals; and
providing an adder to combine the mixed signals to generate an output signal.

2. The method of claim 1, wherein the scaling, mixing and combining create nulls in the spectral energy of the output signal at odd harmonic frequencies.

3. The method of claim 2, wherein the output signal has substantially no spectral energy at least at third and fifth harmonic frequencies.

4. The method of claim 1, wherein the periodic function comprises a sinusoidal function.

5. The method of claim 1, wherein the input signal comprises one of an AM and an FM signal.

6. The method of claim 1, wherein the local oscillator signals comprise square wave signals.

7. A mixer comprising:
a plurality of mixing circuits to receive an input signal and local oscillator signals having different phases, each of the mixing circuits to receive a different one of the local oscillator signals and being adapted to:
apply a scaling factor to the input signal to generate a scaled input signal, the scaling factor being based on the value of a periodic function of the phases for the phase of the received local oscillator signal, the periodic function comprising one of the following mathematical functions: $\sin(2\pi \cdot k/N)$ and $\cos(2\pi \cdot k/N)$, wherein k is a phase index and N is a number of the phases; and
generate an amplitude modulated mixed signal indicative of a product of the scaled input signal and the local oscillator signal; and
an adder to combine the amplitude modulated mixed signals generated by the mixing circuits to provide an output signal.

8. The mixer of claim 7, wherein the scaling factors create nulls in the spectral energy of the output signal at odd harmonic frequencies.

9. The mixer of claim 8, wherein the output signal has substantially no spectral energy at least at third and fifth harmonic frequencies.

10. The mixer of claim 7, wherein the periodic function comprises a sinusoidal function.

11. The mixer of claim 7, wherein at least one of the mixing circuits comprises a Gilbert cell.

12. The mixer of claim 7, wherein at least one of the mixing circuits comprises:
a current source to provide a current, the current source having an aspect ratio indicative of the scaling factor;
at least one resistor to indicate the mixed signal; and
at least one switch controlled in response to the received local oscillator signal to regulate flow of the current to said at least one resistor.

13. The mixer of claim 7, wherein the local oscillator signals comprise square wave signals.

14. A system comprising:
AM and FM receive paths, at least one of the AM and FM receive paths comprising:
an oscillator to generate a plurality of periodic signals having different phases; and
a mixer to translate a frequency of the modulated signal, the mixer comprising:
mixing circuits adapted to:
based on a periodic function of the phases, scale the modulated signal by different degrees to generate scaled signals; and
mix the scaled signals with the local oscillator signals to generate mixed signals, the periodic function comprising one of the following mathematical functions: $\sin(2\pi \cdot k/N)$ and $\cos(2\pi \cdot k/N)$, wherein k is a phase index and N is a number of the phases; and
an adder to combine the mixed signals to provide an output signal.

15. The system of claim 14, wherein the output signal has substantially no spectral energy at least some of its harmonic frequencies.

16. The system of claim 14, wherein the periodic function comprises a sinusoidal function.

17. The system of claim 14, wherein at least one of the mixing circuits comprises a Gilbert cell.

18. The system of claim 14, wherein the wireless receiver comprises at least one of the following:
an AM signal receive path; and
an FM signal receive path.

* * * * *